United States Patent
Cao et al.

(10) Patent No.: US 12,007,818 B2
(45) Date of Patent: Jun. 11, 2024

(54) FLOATING HEAT SPREADER FOR PROCESSING ASSEMBLY

(71) Applicant: GM Cruise Holdings LLC, San Francisco, CA (US)

(72) Inventors: Robert Cao, San Francisco, CA (US); Zoran Stefanoski, San Francisco, CA (US); Brian Schlotterbeck, San Francisco, CA (US); Wen-chieh Tang, San Francisco, CA (US); Roger Lo, San Francisco, CA (US)

(73) Assignee: GM Cruise Holdings LLC, San Francisco, CA (US)

( * ) Notice: Subject to any disclaimer, the term of this patent is extended or adjusted under 35 U.S.C. 154(b) by 292 days.

(21) Appl. No.: 16/867,918

(22) Filed: May 6, 2020

(65) Prior Publication Data

US 2021/0349507 A1 Nov. 11, 2021

(51) Int. Cl.
*H05K 7/20* (2006.01)
*G06F 1/20* (2006.01)
*G05D 1/00* (2006.01)

(52) U.S. Cl.
CPC ........... *G06F 1/20* (2013.01); *H05K 7/20254* (2013.01); *H05K 7/20509* (2013.01); *G05D 1/0088* (2013.01)

(58) Field of Classification Search
CPC ............... H01L 23/4006; H01L 23/427; H01L 23/3672; H01L 2023/4056; H01L 21/4882; H01L 2023/405; H01L 2023/4062; G06F 1/20; G06F 1/206; G06F 1/181; H05K 1/0203; H05K 7/2039; H05K 7/20509; H05K 7/20336; H05K 7/2049; H05K 7/20809; H05K 2201/066; H05K 7/20254
USPC .......... 361/704, 719, 700, 679.54, 706, 709, 361/720, 715, 679.52, 717, 679.46, 703, 361/718; 165/80.3, 104.33, 80.4; 257/23.084, 707
See application file for complete search history.

(56) References Cited

U.S. PATENT DOCUMENTS

| | | | | |
|---|---|---|---|---|
| 2008/0266808 A1* | 10/2008 | Aberg | ................. | H01L 23/4338 361/709 |
| 2008/0316707 A1* | 12/2008 | Liu | ..................... | H01L 23/4006 361/700 |
| 2009/0223647 A1* | 9/2009 | Alousi | ................ | F28D 15/0233 165/80.3 |
| 2010/0326630 A1* | 12/2010 | Wang | ........................ | G06F 1/20 29/890.032 |
| 2011/0279969 A1* | 11/2011 | Memon | ................. | H01L 23/427 361/679.47 |
| 2012/0069525 A1* | 3/2012 | Yang | .................... | H05K 7/2049 361/688 |
| 2012/0092826 A1* | 4/2012 | Heidepriem | ........ | H01L 23/4006 361/679.54 |

(Continued)

*Primary Examiner* — Mandeep S Buttar
(74) *Attorney, Agent, or Firm* — Michael DiCato (57) ABSTRACT

An example automated driving system computer can include a board, one or more processors coupled to the board, a first layer of a first thermal interface material applied on the one or more processors, a heat spreader having a first side and a second side, the first side in contact with the first layer of the first thermal interface material, a second layer of a second thermal interface material applied on the second side of the heat spreader, and a cold plate in contact with the second layer of the second thermal interface material.

18 Claims, 5 Drawing Sheets

(56) References Cited

U.S. PATENT DOCUMENTS

| | | | | |
|---|---|---|---|---|
| 2013/0094227 A1* | 4/2013 | Scordino | ............... | F21V 19/005 362/382 |
| 2013/0258599 A1* | 10/2013 | Danello | ................ | H01L 23/433 361/706 |
| 2013/0258601 A1* | 10/2013 | Qin | ....................... | H05K 7/2049 361/714 |
| 2015/0062820 A1* | 3/2015 | Lam | ....................... | H01L 23/473 361/718 |
| 2017/0221793 A1* | 8/2017 | Smalley | .............. | H01L 25/0655 |
| 2018/0224910 A1* | 8/2018 | Mayer | ................. | F28D 15/0233 |
| 2020/0229318 A1* | 7/2020 | Grau | ................... | H01L 23/4006 |
| 2020/0341525 A1* | 10/2020 | Uchino | ................... | G06F 1/203 |

* cited by examiner

FLOATING HEAT SPREADER FOR PROCESSING ASSEMBLY

TECHNICAL FIELD

The present technology relates generally to thermal management for automated driving system computers and more particularly, to an automated driving system computer in contact with a heat spreader.

BACKGROUND

An autonomous vehicle is a motorized vehicle that can navigate without a human driver. An exemplary autonomous vehicle includes a plurality of sensor systems, such as, but not limited to, a camera sensor system, a lidar sensor system, a radar sensor system, amongst others, wherein the autonomous vehicle operates based upon sensor signals output by the sensor systems. Specifically, the sensor signals are provided to an internal computing system in communication with the plurality of sensor systems, wherein a processor executes instructions based upon the sensor signals to control a mechanical system of the autonomous vehicle, such as a vehicle propulsion system, a braking system, or a steering system.

The internal computing system may be an automated driving system computer (ADSC) or any other high-performance computing system with a wide array of electronic and compute components and systems that work together to perform a number of complex operations for the autonomous vehicle and control various systems on the autonomous vehicle.

BRIEF DESCRIPTION OF THE DRAWINGS

The disclosed and other advantages and features of the present technology will become apparent by reference to specific implementations illustrated in the appended drawings. A person of ordinary skill in the art will understand that these drawings only show some examples of the present technology and would not limit the scope of the present technology to these examples. Furthermore, the skilled artisan will appreciate the principles of the present technology as described and explained with additional specificity and detail through the use of the accompanying drawings in which.

DETAILED DESCRIPTION

Various examples of the present technology are discussed in detail below. While specific implementations are discussed, it should be understood that this is done for illustration purposes only. A person skilled in the relevant art will recognize that other components and configurations may be used without parting from the spirit and scope of the present technology. In some instances, well-known structures and devices are shown in block diagram form in order to facilitate describing one or more aspects. Further, it is to be understood that functionality that is described as being carried out by certain system components may be performed by more or fewer components than shown.

As more processes are computed on an autonomous driving system computer (ADSC) and the ADSC components and processing loads increase, the processors of the ADSC begin generating more heat. High levels of heat can cause damage to the ADSC and the ADSC components. Thus, thermal management has become an important factor in developing the ADSC. In other words, more heat needs to be rejected from the system. For example, autonomous vehicles and ADSCs can experience a variety of harsh and often hazardous conditions, such as extreme temperatures, extreme temperature fluctuations, weather elements (e.g., wind, rain, snow, ice, humidity, etc.), harmful environmental particles or matter (e.g., dust, dirt, grease, etc.), damaging forces (e.g., shock, vibrations, impacts, collisions, etc.), water, rough terrains, and other harsh or hazardous environmental and operating conditions. As a result, thermal management of electronic and compute components in ADSCs can be very challenging as electronic and compute components are vulnerable to, and generally ill-suited to handle, the harsh and extreme weather, operational, and temperature conditions experienced by autonomous vehicles.

ADSCs have implemented various strategies for managing the additional heat. In some embodiments, these systems can include large motherboards with heat generating components and monolithic cold plates that may provide some cooling and mechanical structure. However, the thermal interface gap between these components and the cold plate is important for efficient heat transfer. More specifically, large gaps can significantly reduce cold plate efficiency. Furthermore, due to the monolithic design of the cold plates, a height between components and the cold plate can lead to thick interface gaps. Although these gaps may be filled with thermal interface materials, such as thermal paste, thermal pads, etc., these thermal interface materials have lower conduction rates when compared to other materials. Additionally, adding a separate unit may lead to higher thermal resistance, which may reduce overall heat transfer efficiency. To further compound the issue, the industry trend has been to reduce the solution space allocated for cooling components.

The disclosed technology addresses the need in the art for improved thermal management strategies for automated driving system computers (ADSCs) and ADSC compute and electronic components more generally. More specifically, the disclosed technology includes a heat spreader disposed between a cold plate and the ADSC components. The heat spreader may be spring-loaded to the component in the ADSC, so that a distance between a heat source (e.g. an ADSC processor) and the heat spreader may be well controlled. The heat spreader then distributes heat in-plane to a much larger area that contacts the cold plate. Since heat transfer efficiency is a function of contact area and the larger area that contacts the cold plate increases conduction area significantly, overall heat transfer is significantly increased. In some embodiments, the heat spreader may further have vapor chambers and/or embedded heat pipes therein to maximize spreading efficiency (e.g., in limited thickness environments).

Figure 1:
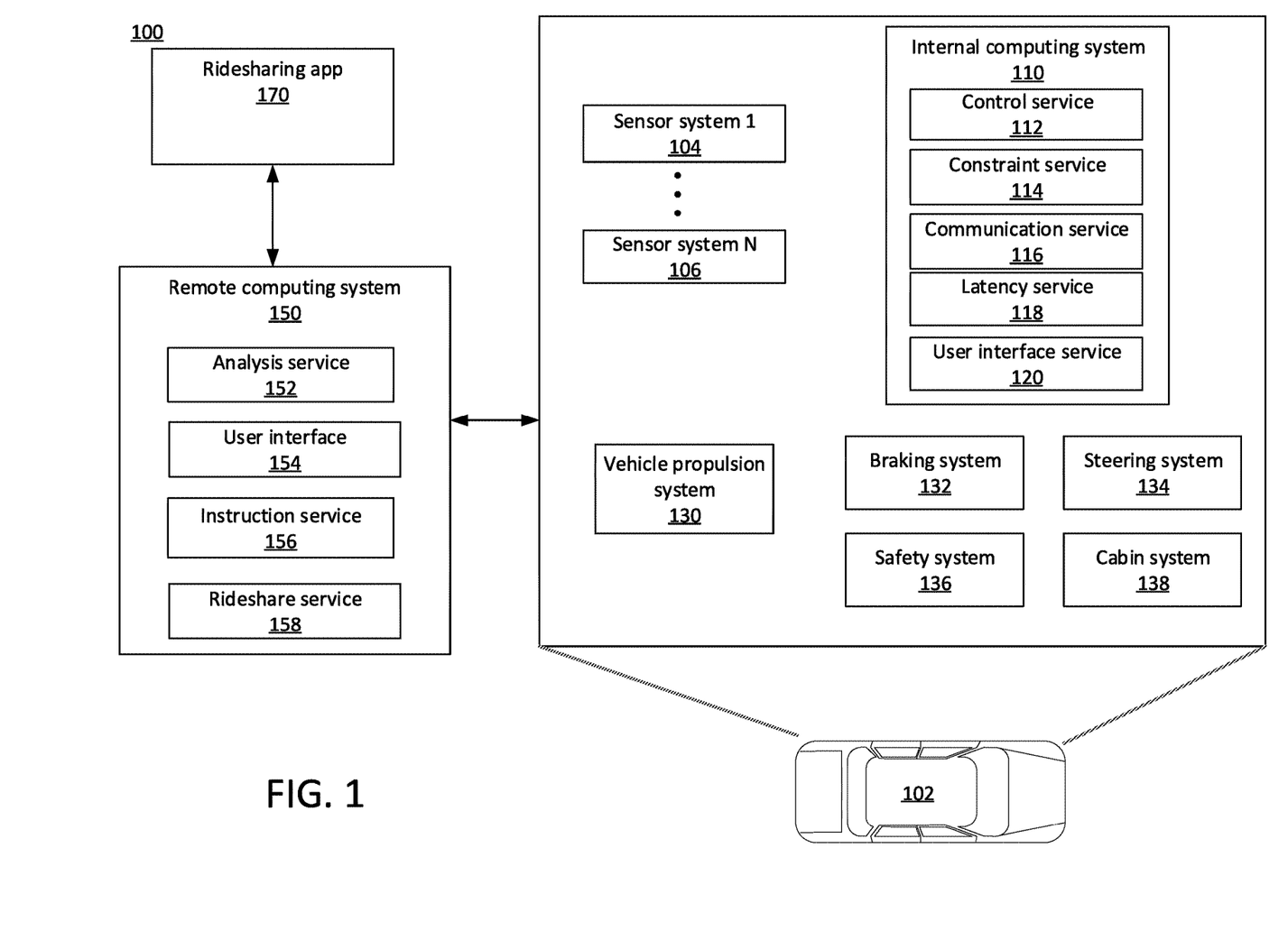
FIG. 1 shows an example system for operating an autonomous vehicle in accordance with some aspects of the present technology.

FIG. 1 illustrates environment 100 that includes an autonomous vehicle 102 in communication with a remote computing system 150.

The autonomous vehicle 102 can navigate about roadways without a human driver based upon sensor signals output by sensor systems 104-106 of the autonomous vehicle 102. The autonomous vehicle 102 includes a plurality of sensor systems 104-106 (a first sensor system 104 through an Nth sensor system 106). The sensor systems 104-106 are of different types and are arranged about the autonomous vehicle 102. For example, the first sensor system 104 may be a camera sensor system, and the Nth sensor system 106 may be a lidar sensor system. Other exemplary sensor systems include radar sensor systems, global positioning system (GPS) sensor systems, inertial measurement units (IMU), infrared sensor systems, laser sensor systems, sonar sensor systems, and the like.

The autonomous vehicle 102 further includes several mechanical systems that are used to effectuate appropriate motion of the autonomous vehicle 102. For instance, the mechanical systems can include but are not limited to, a vehicle propulsion system 130, a braking system 132, and a steering system 134. The vehicle propulsion system 130 may include an electric motor, an internal combustion engine, or both. The braking system 132 can include an engine brake, brake pads, actuators, and/or any other suitable componentry that is configured to assist in decelerating the autonomous vehicle 102. The steering system 134 includes suitable componentry that is configured to control the direction of movement of the autonomous vehicle 102 during navigation.

The autonomous vehicle 102 further includes a safety system 136 that can include various lights and signal indicators, parking brake, airbags, etc. The autonomous vehicle 102 further includes a cabin system 138 that can include cabin temperature control systems, in-cabin entertainment systems, etc.

The autonomous vehicle 102 additionally comprises an internal computing system 110 that is in communication with the sensor systems 104-106 and the systems 130, 132, 134, 136, and 138. The internal computing system includes at least one processor and at least one memory having computer-executable instructions that are executed by the processor. The internal computing system 110 can represent an ADSC as further described herein. The computer-executable instructions can make up one or more services responsible for controlling the autonomous vehicle 102, communicating with remote computing system 150, receiving inputs from passengers or human co-pilots, logging metrics regarding data collected by sensor systems 104-106 and human co-pilots, etc.

The internal computing system 110 can include a control service 112 that is configured to control the operation of the vehicle propulsion system 130, the braking system 132, the steering system 134, the safety system 136, and the cabin system 138. The control service 112 receives sensor signals from the sensor systems 104-106 as well communicates with other services of the internal computing system 110 to effectuate operation of the autonomous vehicle 102. In some embodiments, control service 112 may carry out operations in concert one or more other systems of autonomous vehicle 102.

The internal computing system 110 can also include a constraint service 114 to facilitate safe propulsion of the autonomous vehicle 102. The constraint service 114 includes instructions for activating a constraint based on a rule-based restriction upon operation of the autonomous vehicle 102. For example, the constraint may be a restriction upon navigation that is activated in accordance with protocols configured to avoid occupying the same space as other objects, abide by traffic laws, circumvent avoidance areas, etc. In some embodiments, the constraint service can be part of the control service 112.

The internal computing system 110 can also include a communication service 116. The communication service can include both software and hardware elements for transmitting and receiving signals from/to the remote computing system 150. The communication service 116 is configured to transmit information wirelessly over a network, for example, through an antenna array that provides personal cellular (long-term evolution (LTE), 3G, 5G, etc.) communication.

In some embodiments, one or more services of the internal computing system 110 are configured to send and receive communications to remote computing system 150 for such reasons as reporting data for training and evaluating machine learning algorithms, requesting assistance from remoting computing system or a human operator via remote computing system 150, software service updates, ridesharing pickup and drop off instructions etc.

The internal computing system 110 can also include a latency service 118. The latency service 118 can utilize timestamps on communications to and from the remote computing system 150 to determine if a communication has been received from the remote computing system 150 in time to be useful. For example, when a service of the internal computing system 110 requests feedback from remote computing system 150 on a time-sensitive process, the latency service 118 can determine if a response was timely received from remote computing system 150 as information can quickly become too stale to be actionable. When the latency service 118 determines that a response has not been received within a threshold, the latency service 118 can enable other systems of autonomous vehicle 102 or a passenger to make necessary decisions or to provide the needed feedback.

The internal computing system 110 can also include a user interface service 120 that can communicate with cabin system 138 in order to provide information or receive information to a human co-pilot or human passenger. In some embodiments, a human co-pilot or human passenger may be required to evaluate and override a constraint from constraint service 114, or the human co-pilot or human passenger may wish to provide an instruction to the autonomous vehicle 102 regarding destinations, requested routes, or other requested operations.

As described above, the remote computing system 150 is configured to send/receive a signal from the autonomous vehicle 102 regarding reporting data for training and evaluating machine learning algorithms, requesting assistance from remote computing system 150 or a human operator via the remote computing system 150, software service updates, rideshare pickup and drop off instructions, etc.

The remote computing system 150 includes an analysis service 152 that is configured to receive data from autonomous vehicle 102 and analyze the data to train or evaluate machine learning algorithms for operating the autonomous vehicle 102. The analysis service 152 can also perform analysis pertaining to data associated with one or more errors or constraints reported by autonomous vehicle 102.

The remote computing system 150 can also include a user interface service 154 configured to present metrics, video, pictures, sounds reported from the autonomous vehicle 102 to an operator of remote computing system 150. User interface service 154 can further receive input instructions from an operator that can be sent to the autonomous vehicle 102.

The remote computing system 150 can also include an instruction service 156 for sending instructions regarding the operation of the autonomous vehicle 102. For example, in response to an output of the analysis service 152 or user interface service 154, instructions service 156 can prepare instructions to one or more services of the autonomous vehicle 102 or a co-pilot or passenger of the autonomous vehicle 102.

The remote computing system 150 can also include a rideshare service 158 configured to interact with ridesharing application 170 operating on (potential) passenger computing devices. The rideshare service 158 can receive requests to be picked up or dropped off from passenger ridesharing app 170 and can dispatch autonomous vehicle 102 for the trip. The rideshare service 158 can also act as an intermediary between the ridesharing app 170 and the autonomous vehicle wherein a passenger might provide instructions to the autonomous vehicle 102 to go around an obstacle, change routes, honk the horn, etc.

As described herein, one aspect of the present technology is the gathering and use of data available from various sources to improve quality and experience. The present disclosure contemplates that in some instances, this gathered data may include personal information. The present disclosure contemplates that the entities involved with such personal information respect and value privacy policies and practices.

Figure 2:
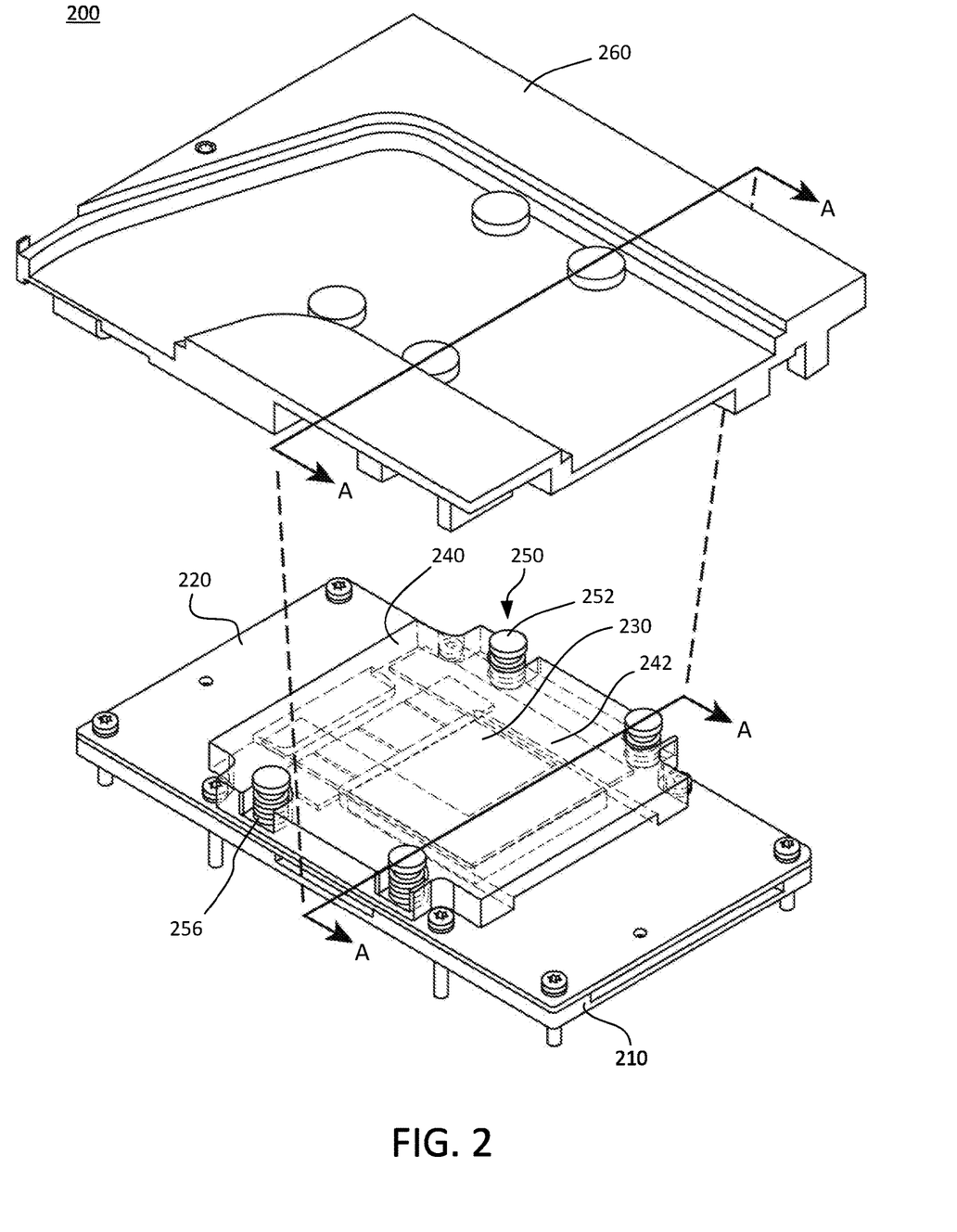
FIG. 2 is a schematic diagram illustrating a top view of an example processing assembly having a heat spreader in contact with a processor of the autonomous vehicle, in accordance with some aspects of the present technology.
Figure 3:
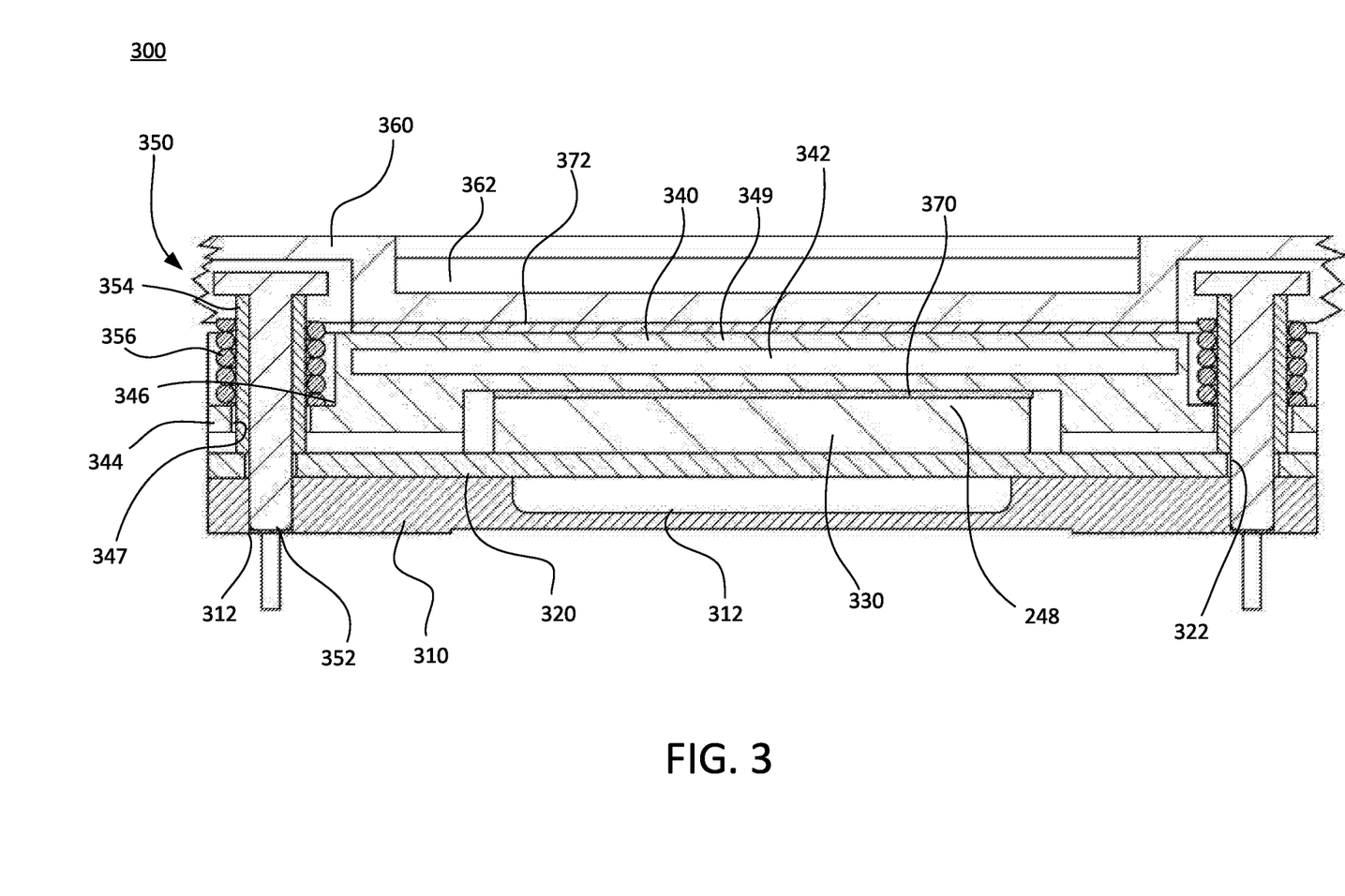
FIG. 3 is an example cross-sectional view along section line A-A in FIG. 2, in accordance with some aspects of the present technology.

FIG. 2 shows an example environment having an ADSC 200, such as internal computing system 110. The ADSC 200 may have a mount 210, a board 220, a processor 230, a heat spreader 240, and a fastener assembly 250. The ADSC 200 may also have a cold plate 260 disposed thereon to transfer heat from the heat spreader 240 as will be discussed further below. FIG. 2 illustrates the cold plate 260 away from a remainder of ADSC 200 for better illustration of the remainder of ADSC 200. It is to be understood that cold plate 260 may rest directly on the remainder of ADSC 200, as shown in FIG. 3.

Mount 210 provides a location for board 220 to be mounted to. In other words, mount 210 receives board 220 and any components secured thereto. In some embodiments, the mount 210 may include, or may be housed within, a chassis that houses and contains board 220, processor 230, heat spreader 240, fastener assembly 250, and the cold plate therein.

Board 220 may be a printed circuit board (PCB) or a power distribution board (PDB), which connects and provides power to various computing components. Board 220 and various computing components may be electrically connected using conductive tracks. For example, a graphics processing unit (GPU) or central processing unit (CPU) may be attached to board 220.

Processor 230 may be a GPU, a CPU, or any other processor capable of performing computer operations. Processor 230 may be configured to control the processes and services of an autonomous vehicle 102. As the processor 230 performs operations and undertakes high compute loads, the processor 230 generates additional heat. Thus, processor 230 may become a large heat source. Without proper thermal management, the additional heat may slow compute and processes and cause damage to the processor 230 and other components nearby. Thus, heat needs to be transferred away from processor 230 to effectively cool the area around processor 230, which may increase compute speed and efficiency and aid in preventing damage to the processor 230 and nearby components.

Heat spreader 240 is configured to spread and transfer heat away from processor 230. More specifically, the heat spreader 240 may include a low resistance and/or conductive material including, but not limited to, copper, aluminum, etc. The low resistance material of the heat spreader 240 may, in comparison to higher resistance materials, allow for higher energy transferring from the heat source (e.g. processor 230) to some other area (e.g. a cold plate). In some embodiments, the heat spreader 240 may comprised completely of the low resistance material and form a solid block to reduce a number of resistive layers between the heat source and a cold plate. In other embodiments, the heat spreader may have a heat pipe and/or a vapor chamber 242 disposed therein.

Fastener assembly 250 is configured to secure the heat spreader 240 to the processor 230 and the board 220. In some embodiments, fastener assembly 250 may also include a screw, 252 and a spring 254 to spring-mount the heat spreader 240 from an upper portion of the fastener assembly 250. Thus, spring 254 may assist in mounting the heat spreader 240 to the processor 230 with a determinable and consistent force.

Cold plate 260 assists in providing thermal management for the processor 230 and the ADSC 200. The cold plate 260 may receive and transfer heat away from the heat spreader 240, so that heat spreader 240 may continue to spread and transfer heat away from processor 230.

FIG. 3 shows a cross-section view of the ADSC 200 of FIG. 2 along section-line A-A with a cold plate 360 added thereon as an ADSC 300.

Like mount 210, mount 310 provides a location for board 320 to be mounted to. Mount 310 may have various channels and/or apertures 312. The channels and/or apertures 312 allow for additional space for circuitry on a side of board 320 that is attached to mount 310. Furthermore, channels and/or apertures 312 provide a location for fastener assembly 350 to secure to mount 310. The apertures 312 may have mating threads disposed therein to threadedly receive fastener assembly 350.

Like board 220, board 320 may be a PCB or a PDB. Board 320 may further have apertures 322 that provide a location for fastener assembly 350 to fit through and secure the board 320 to the mount 310. The apertures 322 may have mating threads disposed therein to threadedly receive fastener assembly 350. Furthermore, board 320 may have components and/or circuitry thereon. For example, board 320 may have a socket, in which processor 330 is disposed.

Like processor 230, processor 330 may be a GPU, a CPU, or any other processor. Processor 330 generates heat when in use. As expected compute and processing loads for processors 330 increase, heat generation is expected to increase as well, which may cause potential damage to the processors 330 and/or any nearby components. Thus, processor 330 is also a heat source, from which heat spreader 340 aids in transferring heat away.

Like heat spreader 240, heat spreader 340 is configured to spread and transfer heat away from a heat source, such as processor 330. The heat spreader 340 may have a heat transfer component 342, distal ledges 344, mounting shoulders 346, apertures 347, a first side 348, and a second side 349.

As discussed above, heat spreader 340 may, in some embodiments, be comprised entirely of one low resistance material to reduce the number of resistive layers in the ADSC 300. Generally, a lower number of resistive layers may aid thermal management by allowing higher throughput of energy through the layers. In other words, each additional layer may increase total resistance of energy being transferred away from the heat source (e.g., processor 330).

However, in some embodiments, heat transfer components 342, such as heat pipes and/or vapor chambers, may be disposed in and/or on heat spreader 340 to aid in heat spreading and thermal management. Likewise, in some embodiments, heat transfer components 342, such as heat pipes and/or vapor chambers, may be formed into heat spreader 340 as one integral unit.

Heat pipes may be at least partly embedded in or coupled to the heat spreader 340. Heat pipes may include a single heat pipe or multiple heat pipes and can include a same or different number, size, shape, and/or configuration of heat pipes. Heat pipes are heat-transfer or dissipation components that implement thermal conductivity and phase transition to transfer heat from one location to another. In some embodiments, each heat pipe may have liquid (e.g., water) inside for transferring heat from a hotter area to a different area. In other words, heat pipes may absorb or collect heat from the first side 348, which is in contact with the heat source or processor 330. Then, the heat pipes may transfer the heat away from the first side 348 to the second side 349, which is in contact with the cold plate 360. In the liquid embodiments, the liquid in each heat pipe can evaporate into a gas as it absorbs heat, travel along the heat pipe to a colder area, and then condense back into a liquid to release the latent heat. Accordingly, the type of liquid used in the heat pipe can be selected based on various properties of the liquid and the environment in which the liquid is being used including, but not limited to, the liquid's compatibility with the system's metals, the liquid's thermal conductivity and specific, viscosity, freezing and melting points, etc.

Vapor chamber may be at least partly embedded in or coupled to the heat spreader 340. In some embodiments, heat spreader 342 may have a single vapor chamber or multiple vapor chambers of same or different sizes, shapes, and/or configurations. Vapor chambers are heat-transfer or dissipation components that implement thermal conductivity and phase transition to transfer heat from one location to another. In some embodiments, each vapor chamber may have a liquid (e.g., water) inside for transferring heat from a hot interface or area of the vapor chamber to a different interface or area (e.g. a colder interface or area). For example, the hot interface of the vapor chamber may be disposed on the first side 348 of the heat spreader 340 and absorb or collect heat from one or more computing components, such as the processor 330, and the different interface of the vapor chamber may be disposed on the second side 349 of the heat spreader 340 and release heat to the cold plate 360. Thus, by transferring heat from the hot interface to the different interface, the vapor chamber can transfer heat away from heat sources like processor 330. Accordingly, the vapor chamber provides cooling and thermal management benefits to the computing components. Like the liquids in heat pipes, the liquids in vapor chambers may be selected on a wide variety of various properties of the liquid and the environment.

Distal ledges 344 may extend from heat spreader 340. Distal ledges 344 provide an area for fastener assembly 350 to secure through and against. More specifically, distal ledges 344 may define mounting shoulders 346, against and through which fastener assembly 350 may be disposed. Furthermore, distal ledges 344 may have apertures 347 disposed therethrough, such that fastener assembly 350 may be positioned through apertures 347 to secure and fasten distal ledges 344 and accordingly heat spreader 340. Consequently, distal ledges 344 are configured to receive forces from fastener assembly 350. Moreover, like the apertures 312, 322, the apertures 347 may have mating threads disposed therein to threadedly receive fastener assembly 350.

Like fastener assembly 250, fastener assembly 350 is configured to secure the heat spreader 340 to the processor 330 and the board 320. The fastener assembly 350 may include a fastener 352, a bushing 354, and a spring 356.

Fastener 352 may be any type of fastener that is capable of securing objects together including, but not limited to, screws, bolts, studs, retainer clips, etc. The fastener 352 may have a fastener base and a fastener body, such that the fastener base is wider than the fastener body. The fastener base provides a base, which bushing 354 and spring 356 may be mounted against. In other words, the fastener base provides an upper base that provides downwards force (e.g., force towards the mount 310 and board 320) as the fastener 352 is secured to the mount 310 and/or board 320. The fastener body may be elongated to accommodate a similar elongated shape of bushing 354 and spring 356. Furthermore, fastener body may be threaded, such that the fastener body may be threaded into mating threads disposed in and/or around apertures 312, 322, 347.

Bushing 354 may be disposed around the fastener body or made integral with a portion of the fastener body. The bushing 354 provides a buffer around the fastener body so that heat from the heat spreader 340 is not transferred to the fastener 352 and the board 320. Additionally, bushing 354 provides a mechanical hard stop for spring deflection, which additionally determines applied pressure. Thus, the bushing may be rigid and have a tight height tolerance. Accordingly, the bushing 354 may be made of non-conductive materials, such as rubber, plastic, etc. Furthermore, the bushing 354 may dampen energy (e.g., heat, vibrations, etc.) between the heat spreader 340, the fastener 352, and/or the board 320, and/or to protect the fastener 352. In some implementations, bushing 354 may be united with and made integral with fastener 352 to form a shoulder. However, it is to be understood that bushing 354 may be separate and/or made integral with fastener 352.

Spring 356 may be disposed around the fastener body and/or the bushing 354. When positioned between the fastener base and the distal ledge 344 of the heat spreader 340, the spring 356 applies a force against the fastener base and the distal ledge 344. As the fastener 352 is secured to the board 320, the spring 356 applies a well-controlled downward force from the fastener base towards the distal ledge 344. Thus, as the distal ledge 344 is forced downwards, heat spreader 340 is also forced downwards. As shown, it is further contemplated that a shape of the heat spreader 340 may allow the heat spreader 340 to avoid contact with the board 320. As the spring 356 compresses and applies downward force onto the heat spreader 340, the heat spreader 340 is compressed onto the processor 330, while also being secured in place and stabilized by the spring 356.

The force applied by spring 356 may be controlled based on selection of a spring having a desired spring constant and a desired length. The force applied can help control a distance between the heat spreader 340 and the processor 330. Smaller distances provide increased heat transfer efficiency because there is less resistive material therebetween. On the other hand, too much force may cause damage to the processor 330 by crushing the processor 330. Thus, controlling the distance between the heat spreader 340 and the processor 330 can improve heat transfer efficiency and prevent damage to the processor 330.

Furthermore, the spring 356 and a shape of the heat spreader 340 may offset the heat spreader 340, such that the heat spreader is not in direct contact with the board 320. In other words, the heat spreader 340 may rest on and be compressed against the processor 330 by the spring 356, such that the heat spreader 340 floats therebetween. As shown, the shape of the heat spreader 340 may allow the heat spreader 340 to avoid contact with the board 320. As the spring 356 compresses and applies downward force onto the heat spreader 340, the heat spreader 340 is compressed onto the processor 330, while also being secured in place and stabilized by the spring 356. By avoiding contact of the heat spreader 340 with the board 320, the heat spreader 340 can transfer heat away from processor 330 and accordingly the board 320 instead of transferring heat to the board 320.

Cold plate 360 assists in providing thermal management for the processor 330 and the ADSC 300. The cold plate 360 may have one or more channels 362 for removing, transferring and/or dissipating heat away from the processor 330. Channels 362 may be one or more fluid channels and can include a fluid or liquid that can flow from a fluid ingress point to a fluid egress point. Like the liquids above, the liquid can be the same type of liquid as the liquid in the heat pipes and/or vapor chambers or a different type of liquid. In some embodiments, the liquid in the channels 362 may include water. In other embodiments, the channels 362 may be used with air or gasses, which can circulate through the channels 362 to transfer, remove, and/or dissipate heat.

Between various components, may be layers of thermal interface materials. The thermal interface materials may be thermal grease, thermal adhesives, thermal gap fillers, thermally conductive pads, thermal tape, phase-change materials, metal thermal interface materials, etc.

A first layer 370 of a first thermal interface material may be applied onto processor 330. As heat spreader 340 is fastened onto processor 330, the first layer 370 of the first thermal interface material may be flattened against the processor 330 and the first side 348 of the heat spreader to fill the distance between the heat spreader 340 and the processor 330. Thus, the spring 356 may also control a thickness of the first layer 370 of the first thermal interface material. As discussed above, the distance between the processor 330 and the heat spreader affects heat transfer efficiency. Some thermal interface materials have higher resistances than some materials used in the heat spreader 340. Thus, in these embodiments, the thickness of the first layer 370 of the first thermal interface material may be as thin as possible. For example, the fastening of heat spreader 340 may reduce the thickness of the first layer 370 and the distance between the heat spreader 340 and processor 330 to a smaller thickness and distance, such as 0.05 millimeters as an illustrative example. With distances so small, control of downward force is provided to control the thickness of the first layer 370 and the distance. The control of downward force can also help prevent damaging components. Thus, the spring 356 aids in controlling the force applied, which in turn controls the thickness of the first layer 370 and the distance.

Similarly, between heat spreader 340 and cold plate 360 is a second layer 372 of a second thermal interface material. More specifically, the second layer 372 of the second thermal interface material may be applied onto the second side 349 of the heat spreader 340. The cold plate 360 may be compressed onto the heat spreader 340, such that the second layer 372 of the second thermal interface material fills a distance between the heat spreader 340 and the cold plate 360. The second thermal interface material may be a same or different material as the first thermal interface material.

Figure 4:
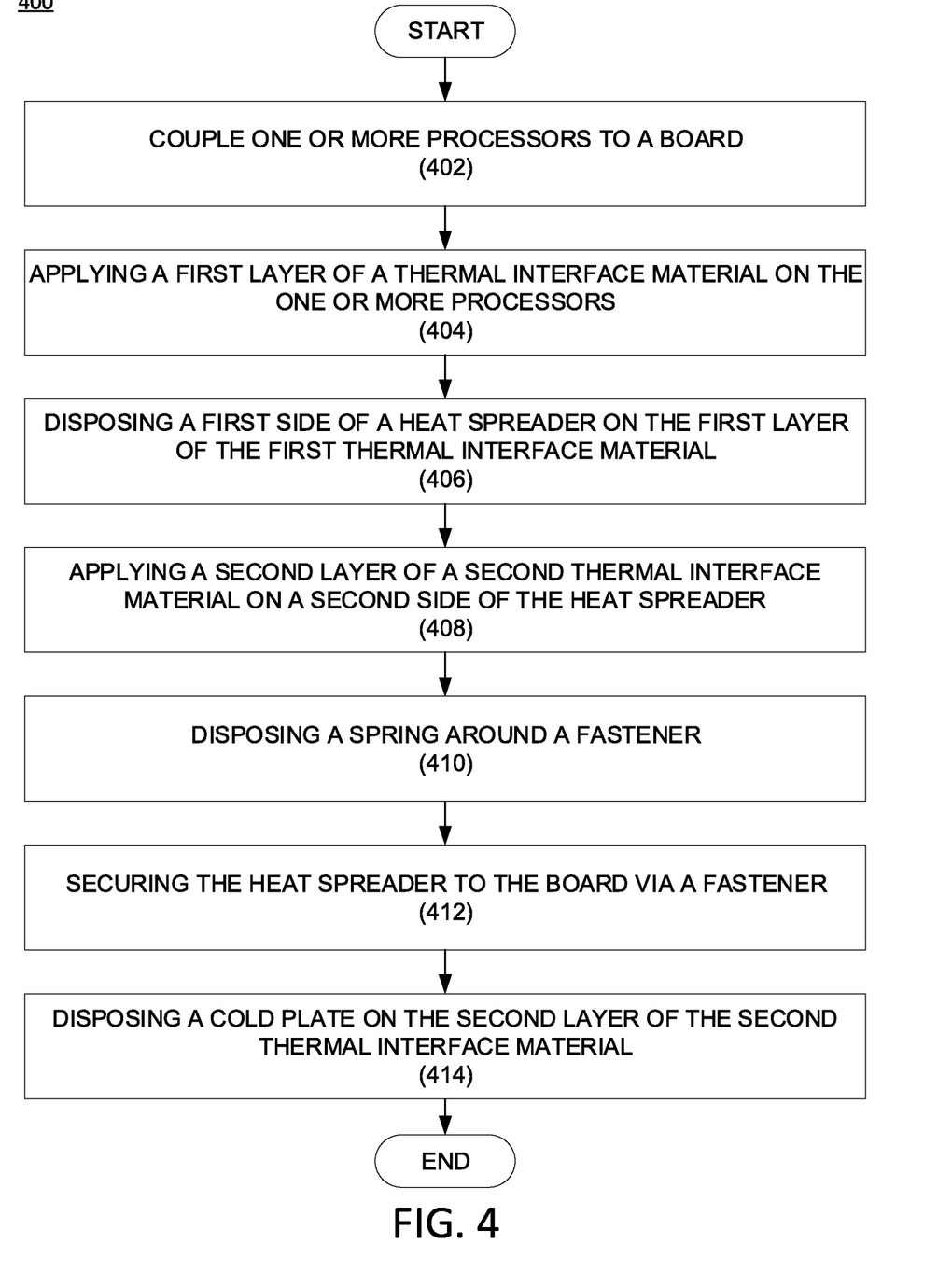
FIG. 4 is an example schematic method diagram for creating a processing assembly, in accordance with some aspects of the present technology.

FIG. 4 shows an example method 400 for creating an ADSC. The steps outlined herein are exemplary and can be implemented in any combinations thereof, including combinations that exclude, add, modify, or rearrange certain steps.

The method 400 starts at step 402, in which one or more processors are coupled to a board. The board may have one or more sockets that may receive and secure the one or more processors thereto.

At step 404 a first layer of a first thermal interface material is applied on the one or more processors.

At step 406 a heat spreader is disposed on the first layer of the first thermal interface material. More specifically, a first side of the heat spreader is disposed on the first layer of the first thermal interface material.

At step 408 a second layer of a second thermal interface material is applied on the heat spreader. More specifically, the second layer of the second thermal interface material is applied on a second side of the heat spreader.

At step 410 a spring is disposed around a fastener. The spring may be disposed circumferentially around the fastener.

At step 412 the heat spreader is secured to the board via the fastener. More specifically, the heat spreader may have distal ledges having apertures. The fasteners thread through the apertures and secure the heat spreader on to the one or more processors and to the board.

At step 414 a cold plate is disposed on the second layer of the second thermal interface material.

Figure 5:
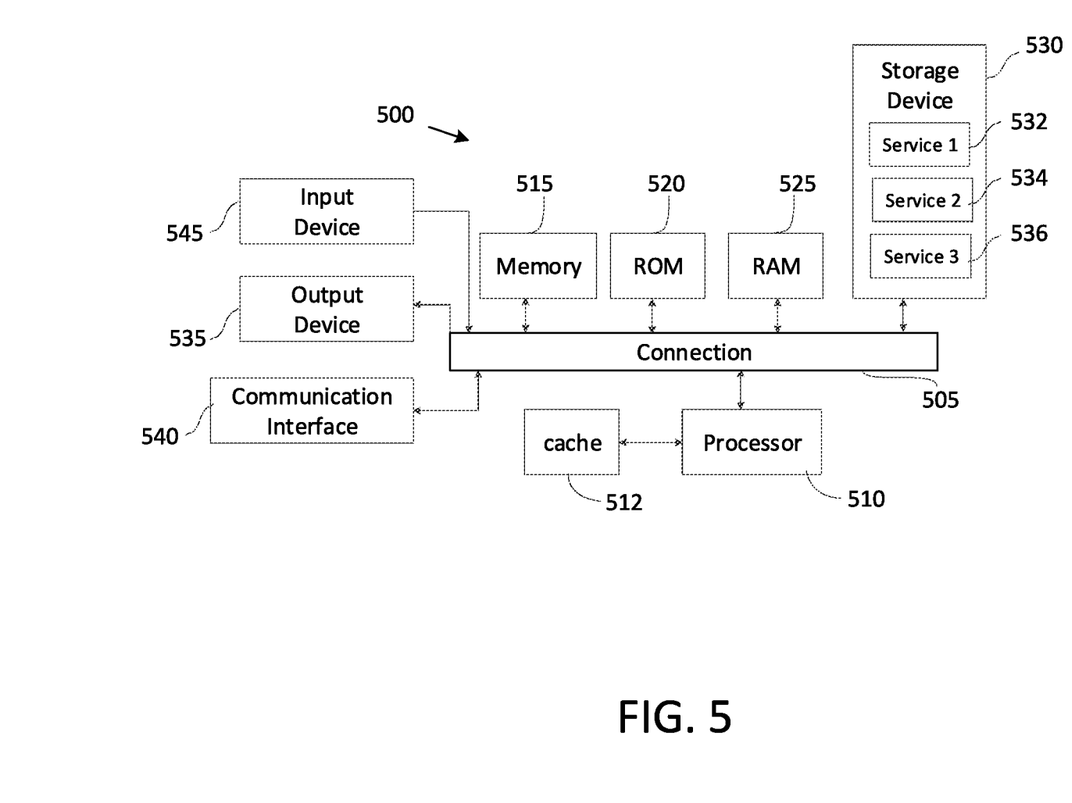
FIG. 5 shows an example of a system for implementing certain aspects of the present technology.

FIG. 5 shows an example of computing system 500, which can be for example any computing device making up internal computing system 110, remote computing system 150, (potential) passenger device executing rideshare app 170, or any component thereof in which the components of the system are in communication with each other using connection 505. Connection 505 can be a physical connection via a bus, or a direct connection into processor 510, such as in a chipset architecture. Connection 505 can also be a virtual connection, networked connection, or logical connection.

In some embodiments, computing system 500 is a distributed system in which the functions described in this disclosure can be distributed within a datacenter, multiple data centers, a peer network, etc. In some embodiments, one or more of the described system components represents many such components each performing some or all of the function for which the component is described. In some embodiments, the components can be physical or virtual devices.

Example system 500 includes at least one processing unit (CPU or processor) 510 and connection 505 that couples various system components including system memory 515, such as read-only memory (ROM) 520 and random access memory (RAM) 525 to processor 510. Computing system 500 can include a cache of high-speed memory 512 connected directly with, in close proximity to, or integrated as part of processor 510.

Processor 510 can include any general purpose processor and a hardware service or software service, such as services 532, 534, and 536 stored in storage device 530, configured to control processor 510 as well as a special-purpose processor where software instructions are incorporated into the actual processor design. Processor 510 may essentially be a completely self-contained computing system, containing multiple cores or processors, a bus, memory controller, cache, etc. A multi-core processor may be symmetric or asymmetric.

To enable user interaction, computing system 500 includes an input device 545, which can represent any number of input mechanisms, such as a microphone for speech, a touch-sensitive screen for gesture or graphical input, keyboard, mouse, motion input, speech, etc. Computing system 500 can also include output device 535, which can be one or more of a number of output mechanisms known to those of skill in the art. In some instances, multimodal systems can enable a user to provide multiple types of input/output to communicate with computing system 500. Computing system 500 can include communications interface 540, which can generally govern and manage the user input and system output. There is no restriction on operating on any particular hardware arrangement, and therefore the basic features here may easily be substituted for improved hardware or firmware arrangements as they are developed.

Storage device 530 can be a non-volatile memory device and can be a hard disk or other types of computer readable media which can store data that are accessible by a computer, such as magnetic cassettes, flash memory cards, solid state memory devices, digital versatile disks, cartridges, random access memories (RAMs), read-only memory (ROM), and/or some combination of these devices.

The storage device 530 can include software services, servers, services, etc., that when the code that defines such software is executed by the processor 510, it causes the system to perform a function. In some embodiments, a hardware service that performs a particular function can include the software component stored in a computer-readable medium in connection with the necessary hardware components, such as processor 510, connection 505, output device 535, etc., to carry out the function.

For clarity of explanation, in some instances, the present technology may be presented as including individual functional blocks including functional blocks comprising devices, device components, steps or routines in a method embodied in software, or combinations of hardware and software.

Any of the steps, operations, functions, or processes described herein may be performed or implemented by a combination of hardware and software services or services, alone or in combination with other devices. In some embodiments, a service can be software that resides in memory of a client device and/or one or more servers of a content management system and perform one or more functions when a processor executes the software associated with the service. In some embodiments, a service is a program or a collection of programs that carry out a specific function. In some embodiments, a service can be considered a server. The memory can be a non-transitory computer-readable medium.

In some embodiments, the computer-readable storage devices, mediums, and memories can include a cable or wireless signal containing a bit stream and the like. However, when mentioned, non-transitory computer-readable storage media expressly exclude media such as energy, carrier signals, electromagnetic waves, and signals per se.

Methods according to the above-described examples can be implemented using computer-executable instructions that are stored or otherwise available from computer-readable media. Such instructions can comprise, for example, instructions and data which cause or otherwise configure a general purpose computer, special purpose computer, or special purpose processing device to perform a certain function or group of functions. Portions of computer resources used can be accessible over a network. The executable computer instructions may be, for example, binaries, intermediate format instructions such as assembly language, firmware, or source code. Examples of computer-readable media that may be used to store instructions, information used, and/or information created during methods according to described examples include magnetic or optical disks, solid-state memory devices, flash memory, USB devices provided with non-volatile memory, networked storage devices, and so on.

Devices implementing methods according to these disclosures can comprise hardware, firmware and/or software, and can take any of a variety of form factors. Typical examples of such form factors include servers, laptops, smartphones, small form factor personal computers, personal digital assistants, and so on. The functionality described herein also can be embodied in peripherals or add-in cards. Such functionality can also be implemented on a circuit board among different chips or different processes executing in a single device, by way of further example.

The instructions, media for conveying such instructions, computing resources for executing them, and other structures for supporting such computing resources are means for providing the functions described in these disclosures.

Although a variety of examples and other information was used to explain aspects within the scope of the appended claims, no limitation of the claims should be implied based on particular features or arrangements in such examples, as one of ordinary skill would be able to use these examples to derive a wide variety of implementations. Further and although some subject matter may have been described in language specific to examples of structural features and/or method steps, it is to be understood that the subject matter defined in the appended claims is not necessarily limited to these described features or acts. For example, such functionality can be distributed differently or performed in components other than those identified herein. Rather, the described features and steps are disclosed as examples of components of systems and methods within the scope of the appended claims.

What is claimed is:

1. An automated driving system computer comprising:
   a board;
   one or more processors coupled to the board;
   a first layer of a first thermal interface material applied on the one or more processors;
   a heat spreader having a first side and a second side, the first side in contact with the first layer of the first thermal interface material, the heat spreader having a shoulder extending therefrom;
   a heat transfer component embedded in the heat spreader, the heat transfer component configured to collect heat from the first side of the heat spreader in contact with the first layer of the first thermal interface material applied on the one or more processors, and transfer the heat to the second side of the heat spreader;
   a fastener disposed through the shoulder of the heat spreader, the fastener securing the heat spreader to the board;
   a spring disposed around the fastener, wherein the spring presses against the shoulder of the heat spreader and thereby compresses the heat spreader against the one or more processors;
   a bushing disposed between the fastener and the spring, wherein the bushing insulates the heat spreader to prevent heat from transferring to the fastener and the board, and wherein the bushing dampens energy transfer between the heat spreader, the fastener, and the board;

a second layer of a second thermal interface material applied on the second side of the heat spreader; and a cold plate in contact with the second layer of the second thermal interface material.

2. The automated driving system computer of claim 1, wherein the heat spreader is not in direct contact with the board.

3. The automated driving system computer of claim 2, wherein the spring controls an amount of force of the heat spreader applies to the one or more processors.

4. The automated driving system computer of claim 1, wherein the heat spreader is made of a conductive material.

5. The automated driving system computer of claim 4, wherein the conductive material is copper.

6. The automated driving system computer of claim 1, wherein the cold plate comprises one or more fluid channels.

7. The automated driving system computer of claim 1, wherein the heat spreader further comprises one or more heat pipes coupled to or embedded in the heat spreader and configured to collect heat from the one or more processors and transfer the heat away from the one or more processors.

8. The automated driving system computer of claim 1, wherein the heat spreader further comprises one or more vapor chambers coupled to or embedded in the heat spreader and configured to collect heat from at least one of the one or more processors and transfer the heat away from the one or more processors.

9. The automated driving system computer of claim 1, wherein the board, the one or more processors, the first and second layers, the heat spreader, and the cold plate are all contained in a chassis.

10. A method comprising:

coupling one or more processors to a board;

applying a first layer of a first thermal interface material on the one or more processors;

disposing a first side of a heat spreader on the first layer of the first thermal interface material, wherein the heat spreader has a shoulder extending therefrom, and a heat transfer component embedded in the heat spreader, the heat transfer component configured to collect heat from the first side of the heat spreader in contact with the one or more processors, and transfer the heat to a second side of the heat spreader;

disposing a spring around a fastener;

disposing a bushing between the fastener and the spring, wherein the bushing insulates the heat spreader to prevent heat from transferring to the fastener and the board, and wherein the bushing dampens energy transfer between the heat spreader, the fastener, and the board;

securing the heat spreader to the board by disposing the fastener through the shoulder of the heat spreader, wherein the fastener secures the heat spreader to the board, and wherein the spring presses against the shoulder of the heat spreader and thereby compresses the heat spreader against the one or more processors;

applying a second layer of a second thermal interface material on the second side of the heat spreader; and disposing a cold plate on the second layer of the second thermal interface material.

11. The method of claim 10, wherein the heat spreader is not in direct contact with the board.

12. The method of claim 11, wherein the spring controls an amount of force of the heat spreader applies to the one or more processors.

13. The method of claim 10, wherein the heat spreader is made of a conductive material.

14. The method of claim 13, wherein the conductive material is copper.

15. The method of claim 10, wherein the cold plate comprises one or more fluid channels.

16. The method of claim 10, wherein the heat spreader further comprises one or more heat pipes coupled to or embedded in the heat spreader and configured to collect heat from the one or more processors and transfer the heat away from the one or more processors.

17. The method of claim 10, wherein the heat spreader further comprises one or more vapor chambers coupled to or embedded in the heat spreader and configured to collect heat from at least one of the one or more processors and transfer the heat away from the one or more processors.

18. The method of claim 10, wherein the board, the one or more processors, the first and second layers, the heat spreader, and the cold plate are all contained in a chassis.

* * * * *